United States Patent [19]

Harms et al.

[11] Patent Number: 5,202,631
[45] Date of Patent: Apr. 13, 1993

[54] MAGNETIC RESONANCE IMAGING TECHNIQUES UTILIZING MULTIPLE SHAPED RADIOFREQUENCY PULSE SEQUENCES

[75] Inventors: Steven E. Harms, 3100 Beverly Dr., Dallas, Tex. 75205; Duane P. Flamig, 1411 Scottsboro La., Richardson, Tex. 75082; Richard H. Griffey, San Marcos, Calif.

[73] Assignees: Steven E. Harms; Duane P. Flamig, Dallas, Tex.

[21] Appl. No.: 743,523
[22] Filed: Aug. 9, 1991
[51] Int. Cl.$^5$ .............................................. G01R 33/20
[52] U.S. Cl. ..................................... 324/309; 324/307
[58] Field of Search ............... 324/300, 307, 309, 310, 324/311, 312, 313, 314, 318, 322; 128/653.2, 653.5

[56] References Cited

U.S. PATENT DOCUMENTS

| | | | |
|---|---|---|---|
| 4,684,890 | 8/1987 | Briguet et al. | 324/309 |
| 4,703,270 | 10/1987 | Hall et al. | 324/309 |
| 4,733,190 | 3/1988 | Dembinski | 324/318 |
| 4,734,647 | 3/1988 | Yoshimura | 324/318 |
| 4,746,864 | 5/1988 | Satoh | 324/309 |
| 4,799,016 | 1/1989 | Rezvani | 324/318 |
| 4,833,409 | 5/1989 | Eash | 324/318 |
| 4,843,322 | 6/1989 | Glover | 324/309 |
| 4,857,843 | 8/1989 | Macovski | 324/307 |
| 4,987,371 | 1/1991 | Glover et al. | 324/320 |
| 5,079,505 | 1/1992 | Deimling et al. | 324/311 |

OTHER PUBLICATIONS

Steven E. Harms "Three-Dimensional and Dynamic MR Imaging of the Musculoskeletal System", (Nov. 1990).
Harms and Muschler, "Three Dimensional MR Imaging of the Knee Using Surface Coils," Journal of Computer Assisted Tomography; 10(5):773-777 (1986).
Sherry et al., "Spinal MR Imaging: Multiplanar Representation from a Single High Resolution 3 D Acquistion," Journal of Computer Assisted Tomography; 11(5):859-862 (1987).
Robert L. Tyrrell, "Fast Three-Dimensional MR Imaging of the Knee: Comparison with Arthroscopy", Radiology; 166:865-872.
Charles E. Spritzer, et al., "MR Imaging of the Knee: Preliminary Results with a 3DFT GRASS Pulse Sequence", American Journal of Roentology; 150: 597-603 (1988).
Alan M. Haggar et al.,"Meniscal Abnormalities of the Knee: 3DFT Fast Scan GRASS MR Imaging", American Journal of Roentology; 150: 1341-1344 (1988).
"Method Combines Vascular, Anatomic Data", Diagnostic Imaging: 140-141 (Feb. 1991).
Harms et al.; "Clinical Application of a New Fat Suppressed, Steady State Pulse Sequence for High Resolution Acquisitions" Book of Abstracts; vol. 1, Society of Magnetic Resonance in Media; 187; Aug. 18, 1990.
Herbert Y. Kressel, et al., ed., "New MR Pulse Sequence: Fat-Suppressed Steady State", Syllabus: Special Course, MR 1990, Radiological Society of North America (Nov. 1990).
"RSNA '90 Meeting Notes," Radiology 1991; 178:559 (1991).
Yaguinto et al., "Arterial Injury from Penetrating Trauma: Evaluation with Single Acquisition Fat Suppressed MR Imaging; American Journal of Roentology"; 158:631-633 (Mar. 1992).
Pierce et al., "Three Dimensional Gadolinium-Enhanced MR Imaging of the Breast: Pulse Sequence with Fat Supression and Magnetization Transfer Constrast"; Radiology 181: 757-763 (1991).
Harms et al., "Three-Dimensional Imaging", Magnetic Resonance Imaging of the Body, Second Edition Raven Press Ltd.; 199-215 (1992).

*Primary Examiner*—Michael J. Tokar
*Attorney, Agent, or Firm*—Konneker & Bush

[57] ABSTRACT

Method for producing an image of an object, for example, tissue having fat and water components. A uniform magnetic field is generated to magnetize the object. A shaped pulse sequence is selected for each of waveform, phase and frequency components of an RF signal. An RF signal which includes the selected waveform, amplitude and frequency pulse sequences is generated to produce transverse magnetization in the object. First, second, and third changing magnetic fields are then generated in the object and a series of gradient echoes are produced in response thereto. From the gradient echoes, an image of the object may be produced.

19 Claims, 15 Drawing Sheets

RF WAVEFORM 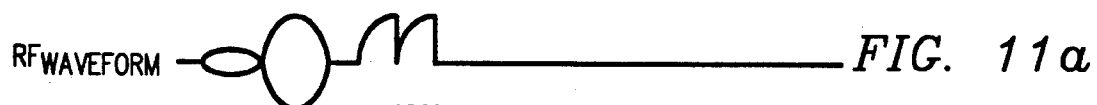 ——— FIG. 11a
RF PHASE 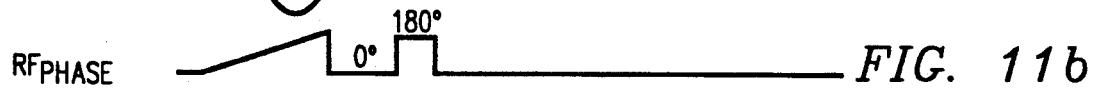 ——— FIG. 11b
RF FREQUENCY 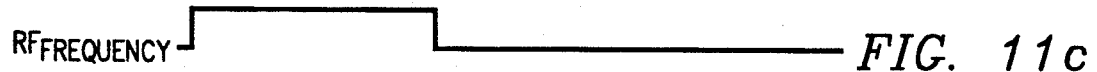 ——— FIG. 11c
G SLICE  ——— FIG. 11d
G ENCODE  ——— FIG. 11e
G READ 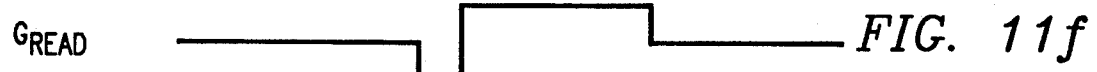 ——— FIG. 11f
ADC 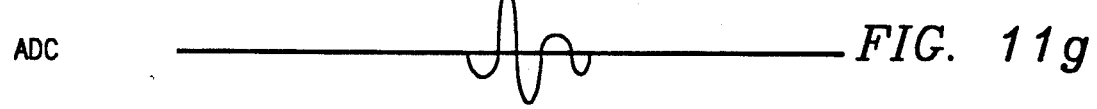 ——— FIG. 11g

MAGNETIC RESONANCE IMAGING TECHNIQUES UTILIZING MULTIPLE SHAPED RADIOFREQUENCY PULSE SEQUENCES

BACKGROUND OF THE INVENTION

1. Field of the Invention

This invention relates to magnetic resonance imaging techniques and, more particularly, to a method for selectively suppressing and/or exciting chemical components in tissue to modify a magnetic resonance image produced in response to a multiple shaped radiofrequency pulse sequence applied prior to the generation of a magnetic field gradient pulse sequence.

This invention further relates to a magnetic resonance imaging technique in which a multiple shaped radiofrequency pulse sequence manipulates the magnetization in the transverse plane of tissue being imaged in a manner which enhances the contrast among chemical components in the tissue.

2. Description of Related Art

Magnetism results from the motion of electric charges such as electrons. Electrons can produce a magnetic field either by motion along a path or by virtue of their intrinsic spin. The particles that comprise the atomic nucleus, collectively called nucleons, also have spin and magnetic moment. Because both individual nucleons and nuclei have a charge distribution, rotation or spin of this charge produces a magnetic dipole whose value is called a magnetic moment. The numeric value of the magnetic moment determines the energies of the different orientations of a nucleus in an external magnetic field. The proton is positively charged and has a relatively large magnetic moment. Although neutral, the neutron also has a net magnetic moment. A neutron's magnetic moment is about two-thirds of the value of the proton's and points against the axis of spin. When in the nucleus, like nucleons align with their spins pointing against each other. This phenomena is called "pairing" and is favored because it leads to a lower nuclear energy state. Therefore, only the unpaired, odd proton or neutron, or both, contribute their magnetic moment to the nucleus. As a consequence, only nuclei with odd numbers of protons or neutrons, or both, have a magnetic moment. The magnetic properties of nuclei become important when they are placed in external magnetic fields as the nuclei will have a tendency to align with the external field.

Resonance occurs when an amount of energy equal to the difference of energy associated with the transition between states is absorbed or released. In the case of a magnetic moment of a nucleus, transitions between parallel or "up" and anti-parallel or "down" states can occur if the correct amount of energy is absorbed or released. Because the interaction is with a magnetic element, the necessary energy can be provided by a magnetic field. One way to obtain such a field is by utilizing electromagnetic radiations. To induce resonance, the frequency f of the electromagnetic radiation must be proportional to the local magnetic field $H_L$. The particular proportionality constant which will induce resonance varies depending on the particular nucleus involved. The relationship between frequency and field is given by:

$$f = (gamma) H_L/2(pi) \qquad (1)$$

where (gamma) is the magnetogyric ratio of the nucleus.

When the nuclei, originally in equilibrium with the field, are irradiated at the resonant frequency, the nuclei can adopt the anti-parallel state. When the return to equilibrium, if the field is unchanged, they will radiate emissions of the same frequency. If between excitation and radiation the field strength is changed, the nuclei will radiate a frequency corresponding to the new field value. This behavior of nuclei may be described by net magnetization vector N which characterizes the system by disregarding the state of each nucleus and considers only the net collective effect. In a magnetic field, the magnetization vector points along the field. The length of the magnetization vector is proportional to the number of nuclei in the sample and to the field strength and is inversely proportional to temperature. The length and direction of this vector characterizes the equilibrium magnetization of the sample; that is, the state that it will revert to after being disturbed if enough time is allowed to pass. This equilibrium magnetization is given by:

$$(mu)^2 H/kT \qquad (2)$$

where:
 (mu) is the nuclear magnetic moment;
 k is Boltzmann's constant; and
 T is the absolute temperature.

This vector can be disturbed from equilibrium by the application of a second external magnetic field. If such a field is superimposed upon the first magnetic field, M will align with the new net field. As M moves to its new direction, energy stored in the nuclei of the sample is provided by the second field. When the superimposed field is removed, M returns to equilibrium and the nuclei release the stored energy to the environment, either as heat or RF energy. These two fields are called the transverse field and the longitudinal field, respectively. More specifically, the component of M that points along the main field is called the longitudinal magnetization ($M_L$) and the orthogonal component is called the transverse magnetization ($M_T$). If the transverse field is an RF field at the resonant frequency, M behaves as a top such that, as it deviates from the longitudinal axis, it precesses about it. If the main magnetic field is defined as being aligned along the z axis, then $M_T$ rotates in the x,y plane and $M_L$ is reduced from its equilibrium value. If M is rotated onto the x,y plane by a 90 degree RF pulse, $M_L$ is 0.

Immediately after an RF irradiation, $M_L$ begins to grow again towards its equilibrium value M. This growth is exponential with a time constant T1 such that:

$$M_L = M[1 - \exp(-t \setminus T1)] \qquad (3)$$

where t is the time since irradiation.

During this process, $M_T$ decays exponentially with a time constant T2 such that:

$$M_T = M_{T0} \exp(-t \setminus T2) \qquad (4)$$

where:
 $M_{T0}$ is the value of $M_T$ immediately after irradiation; and
 t is the lapse time.

When a proton is aligned with the magnetic field, it gives off no signal. When a proton is perpendicular to the field, it gives off a maximum signal. The rate at which a proton realigns with the static field is called its "T1" or "T1 relaxation time". The T1 relaxation time is also called "spin-lattice" or "thermal relaxation time". The individual protons exchange fixed amounts of energy when they flip from the down to up alignment in the process of returning to equilibrium. This exchange can occur only at the resonant frequency. A molecule in the lattice surrounding the resonant nucleus appears as an oscillating electric magnetic field with frequency that depends on its thermal velocity and mean free path. Since both vary over a broad range for any one temperature, of the whole ensemble of molecules, only a small fraction provide the right oscillating fields. These then coupled with the nucleus and allow the relaxation to occur. As temperature and molecular composition changes so does the distribution of velocities and mean free paths, thus affecting T1.

When a group of protons precess in phase, the voxel gives off a maximum signal. When a group of protons precess out of phase, the voxel gives off no signal. The rate at which the protons de-phase is called its "T2" or "T2 relaxation time". The T2 relaxation time is also called the "spin-spin" or "transverse relaxation time". In a perfectly uniform magnetic field, all nuclei will resonate at exactly the same frequency, but if the field is even slightly inhomogeneous, nuclei resonate at slightly different frequencies. Although immediately after an RF irradiation, the nuclei are all in phase, they soon lose coherence and the signal that is observed, decays. Any such loss of coherence shortens T2. Thus, the effects due to inhomogeneities in the external field produce a rapid decay characterized by the relaxation time T2.

Magnetic resonance has become an established method for producing an image of the internal structure of an object. Such methods have numerous applications particularly in medical diagnostic techniques. For example, the examination and diagnosis of possible internal derangements of the knee is one such application of magnetic resonance imaging techniques. Most magnetic resonance techniques for knee imaging use a two-dimensional (or "2D") acquisition with a spin-echo pulse sequence to provide T1, T2 and proton density weighted images of the knee in multiple planes, typically the sagittal (y-z) and coronal (x-z) planes. However, the selective excitation techniques used by conventional 2D methods is limited in the ability to obtain thin slices by the gradient strength of the system. Furthermore, obtaining images in non-orthogonal planes is often advantageous for proper medical diagnosis. However, to obtain images in a non-orthogonal plane, the use of 2 gradients rather than a single gradient is required to obtain a slice. Finally, oblique plane imaging of an object requires a corrected procedure after obtaining each gradient echo to keep the slices passing through the object being imaged.

As a result of the shortcomings of 2D methods, three dimensional (or "3D") acquisitions of magnetic resonance data has been used to produce thin slice, high resolution images. See, for example, the publications to Steven E. Harms, "Three-dimensional and Dynamic MR Imaging of the Musculoskeletal System"; Harms and Muschler, "Three-Dimensional MR Imaging of the Knee Using Surface Coils", *Journal of Computer Assisted Tomography*; 10(5): 773–777 (1986) and Sherry et al., (Spinal MR Imaging: Multiplanar Representation from a Single High Resolution 3D Acquisition", *Journal of Computer Assisted Tomography*; 11(5): 859–862 (1987); Robert L. Tyrrell, "Fast Three-dimensional MR Imaging of the Knee: Comparison with Arthroscopy", *Radiology*; 166: 865–872 (1988); Charles E. Spritzer, et al., "MR Imaging of the Knee: Preliminary Results with a 3DFT GRASS Pulse Sequence", *American Journal of Roentology*; 150: 597–603 (1987); Alan M. Haggar, et al., "Meniscal Abnormalities of the Knee: 3DFT Fast-Scan GRASS MR Imaging", *American Journal of Roentology*; 150: 1341–1344 (1988).

Also disclosed in the article to Steven E. Harms entitled "Three-dimensional and Dynamic MR Imaging of the Musculoskeletal System" is a pulse sequence referred to as a "fast adiabatic trajectory in steady state" or "FATS" pulse sequence. The FATS RF pulse sequence is characterized by the utilization of non-selective opposing 20 degree adiabatic half-passage pulses that result in no effective magnetization or resonance. Because the sequence is tuned to fat, water signal is detected off resonance. See also the article entitled "Method combines vascular, anatomic data", *Diagnostic Imaging*, pgs. 140–42 (February, 1991). While the FATS type RF pulse sequence tends to suppress the fat signal, the FATS type RF pulse sequence tends to have a relatively narrow null bandwidth, thereby decreasing the effectiveness of the fat suppression since off resonance fat would not be suppressed.

SUMMARY OF THE INVENTION

In one aspect, the present invention is of a method for producing an image of an object, for example, tissue having fat and water components. First, a uniform magnetic field is generated to magnetize the object. A shaped pulse sequence is selected for each of waveform, phase and frequency components of an RF signal. An RF signal which includes the selected waveform, amplitude and frequency pulse sequences is generated to produce transverse magnetization in the object. First, second, and third changing magnetic fields are then generated in the object and a series of gradient echoes are thusly produced in response to the RF pulse sequence. From these echoes, an image of the object may be produced.

BRIEF DESCRIPTION OF THE DRAWINGS

The present invention may be better understood, and its numerous objects, features and advantages will become apparent to those skilled in the art by reference to the following drawings in which:

FIG. 3e is a schematic diagram of an echo sequence produced by the generation of the pulse sequences of FIGS. 3b–d in the presence of the transverse magnetization produced by the pulse sequence of FIG. 3a;

FIG. 4 is a expanded schematic diagram of the multiple shaped radiofrequency pulse sequence of FIG. 3a;

FIGS. 5a–c are schematic diagrams of the waveform, phase and frequency components, respectively, of a first embodiment of the shaped radiofrequency pulse sequence of FIG. 3a;

FIGS. 6a–c are schematic diagrams of the waveform, phase and frequency components, respectively, of a second embodiment of the shaped radiofrequency pulse sequence of FIG. 3a;

FIGS. 7a–c are schematic diagrams of the waveform, phase and frequency components, respectively, of a third embodiment of the shaped radiofrequency pulse sequence of FIG. 3a;

FIGS. 8a–c are schematic diagrams of the waveform, phase and frequency components, respectively, of a fourth embodiment of the shaped radiofrequency pulse sequence of FIG. 3a;

FIGS. 9a–c are schematic diagrams of the waveform, phase and frequency components, respectively, of a fifth embodiment of the shaped radiofrequency pulse sequence of FIG. 3a;

FIGS. 10a–c are schematic diagrams of the waveform, phase and frequency components, respectively, of a sixth embodiment of the shaped radiofrequency pulse sequence of FIG. 3a;

FIGS. 11a–c are schematic diagrams of the waveform, phase and frequency components, respectively, of a seventh embodiment of the shaped radiofrequency pulse sequence of FIG. 3a;

FIGS. 11d–f are schematic diagram of a first phase encoding pulse sequence, a first frequency encoding pulse sequence and a second phase encoding pulse sequence to be generated along first, second and third axes, respectively;

FIG. 11g is a schematic diagram of an echo sequence produced by the generation of the pulse sequences of FIGS. 11d–f in the presence of the transverse magnetization produced by the pulse sequence of FIGS. 11a–c;

DETAILED DESCRIPTION

Figure 1:
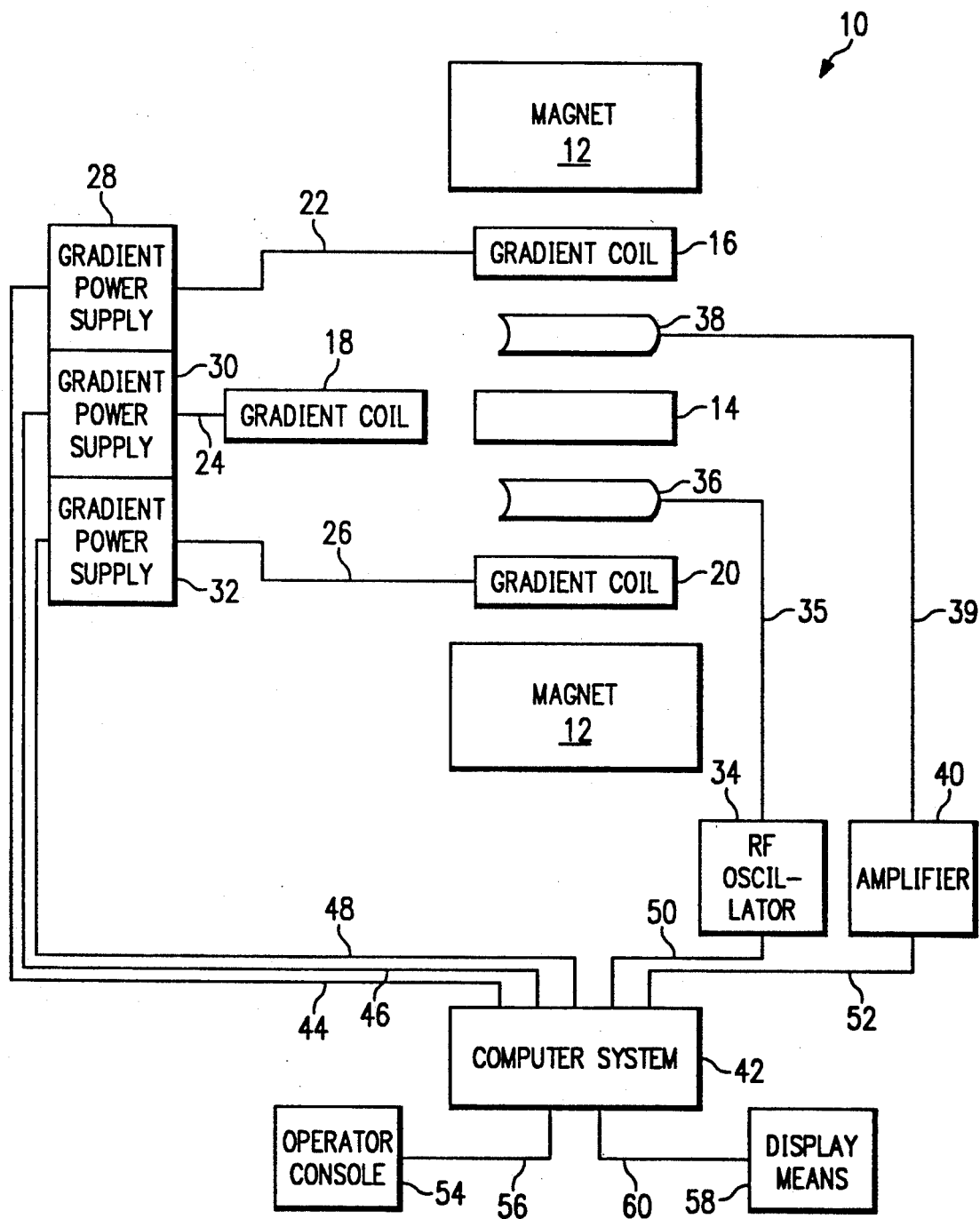
FIG. 1 is a block diagram of an apparatus for producing images of an object using magnetic resonance imaging techniques.

Referring first to FIG. 1, a magnetic resonance imaging system 10 for use in conjunction with the teachings of the present invention shall now be described. As is well known in the art, magnetic resonance (or "MR") imaging requires a strong, uniform and stable magnetic field to magnetize the object being imaged. Accordingly, the MR imaging system 10 is provided with a magnetic 12, for example a superconducting magnet, for generating the aforementioned strong, uniform and stable magnetic field required for magnetizing an object 14, for example, a portion of a human body, which is to be imaged. As MR imaging also requires first, second and third rapidly changing weak magnetic field gradients along x, y and z axes, respectively, the MR imaging system 10 is further provided with a first set of gradient coils 16 for generating a rapidly changing, weak magnetic field gradient along the x axis, a second set of gradient coils 18 for generating a rapidly changing, weak magnetic field gradient along the y axis and a third set of gradient coils 20 for generating a rapidly changing, weak magnetic field gradient along the z axis. Each gradient coil set 16, 18, 20 may be, for example, two coils, each with currents flowing in a direction opposite to that in the other. Preferably, each gradient coil set 16, 18, 20 is configured to generate a gradient in a volume at the center of the coil sets where the object 14 is positioned. The first, second and third gradient coil sets 16, 18, 20 are driven by a respective gradient power supply 28, 30, 32 connected to the corresponding gradient coil set 16, 18, 20 by an electrical connector 22, 24, 26, respectively, of conventional design. Preferably, each gradient coil subsystem 16, 22 and 28, 18, 24 and 30, 20, 26 and 32 should be configured to generate a 10 mT/m or greater gradient magnetic field controllable within precise limits with rise times of one msec or better.

As MR imaging further requires the generation of a radio frequency (or "RF") field to excite nuclear spins, the MR imaging system 10 further includes a low power RF oscillator 34 capable of waveform, phase and frequency modulation as required to meet imaging needs more fully described below, an RF transmitter coil 36 which surrounds the object being imaged and which generates an RF signal having the selected waveform, phase and frequency modulation characteristics, and an RF receiver coil 38 which also surrounds the sample but which is electrically isolated with respect to the RF transmitter coil 32. As the RF magnetic field generated by the RF transmitter coil 32 must be 90° to the main field generated by the magnet, the shape of the RF transmitter coil may be varied according to the direction of the main magnetic field with respect to the axis of the object 14. The RF oscillator 34 supplies RF power to the RF transmitter coil 36 via an electrical connector 35 where the RF magnetic field is transmitted into the object for exciting spins. Echoes are detected by the RF receiver coil 34, and transmitted via an electrical connector 39 to a low noise electronic amplifier 40 for digitization of the detected echoes. The RF field and echoes may be acquired using a Signa 1.5 Tesla imager manufactured by General Electric Medical Systems of Milwaukee, Wis. The imager is to be used typically in conjunction with a transmit-receive coil, also manufactured by General Electric Medical Systems, which is typically varied depending on the particular body area being imaged. For example, a quadrature head coil is to be used for cranial and foot examinations; a quadrature body coil is used for imaging of the thighs and pelvis; a linear transmit-receive extremity coil is preferably used in connection with the imaging of the knee, calf, ankle, arm and wrist; and receive-only surface coils are preferably used for the examination of the spine, shoulder, breast and neck.

The first, second and third gradient coil systems 16, 22 and 28, 18, 24 and 30, and 20, 26 and 32, as well as the RF transmitter coil 36 and RF receiver coil 38 are controlled by a computer system 42 via a corresponding electrical connector 44, 46, 48, 50 and 52, respectively.

Typically, the computer system 42 will include a sequence control means for generating first, second and third voltage wave forms for transmission to the first, second and third gradient power supplies 28, 30 and 32 where first, second and third gradient magnetic pulse sequences corresponding to the voltage wave forms are produced for transmission by the first, second and third gradient coil sets 16, 18 and 20. The computer system 42 will further include means for generating multiple shaped RF pulse sequences which may include waveform, phase and frequency modulation, for transmission to the RF oscillator 34. Finally, the computer system 42 will also include data processing means for performing conventional data processing techniques such as Fourier transforms, data filtering, and data storage functions, as well as additional post processing functions such as maximum pixel ray casting.

The computer system 42 is connected to an operator console 54, for example, a keyboard of conventional design, by an electrical connector 56 and display means 58, for example a CRT of conventional design, by an electrical connector 60. The operator of the console 54 controls the production of an image of an object 14 through the computer system 42 as well as the display of the produced image by the display means 58. A computer system 42, operator console 54 and display means 58 which shall be satisfactory for the uses contemplated herein, may be provided by Model 3/260 workstation equipped with a TAAC accelerator manufactured by Sun Microsystems of Mountain View, Calif. Furthermore, if direct filming of the images displayed on the display means 58 are desired, a 35 mm camera may be used to photograph the displayed images.

Figure 2:
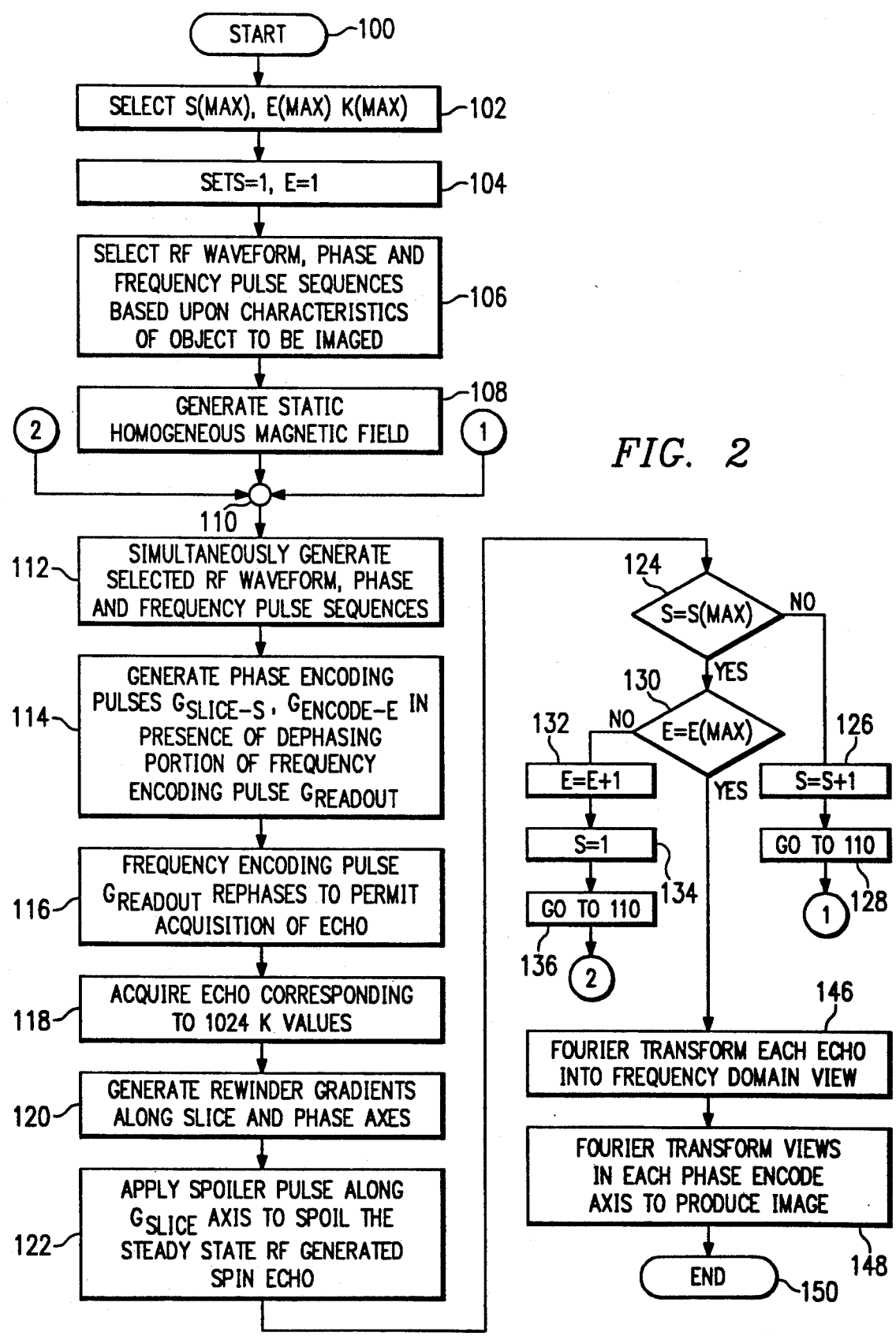
FIG. 2 is a flow chart of a multiple shaped radiofrequency pulse sequence magnetic resonance imaging technique subject of the present invention.

Referring next to FIG. 2, the magnetic resonance imaging techniques utilizing multiple shaped radiofrequency (or "RF") pulse sequences subject of the present invention shall now be described in greater detail. As to be more fully described below, the MR imaging techniques described herein may be generally characterized as selecting a shaped pulse sequence for each of waveform, phase and frequency components of an RF signal, most commonly, based upon characteristics of the object to be imaged, generating the selected multiple shaped RF pulse sequence, generating a series of magnetic field gradient pulses which will produce a gradient echo in response to the sequence of RF pulses such that the intensity of certain signals of the image which will be modified in accordance with certain prior objectives considered when selecting the multiple shaped RF pulse sequences.

The multiple shaped RF pulse sequences disclosed herein, when selected and then later utilized to produce an image of the object, permit a significant amount of control over the extent to which selected chemical components of the object may be suppressed and/or enhanced during image production. Specifically, the disclosed RF pulse sequences may be utilized to produce a "null" at a desired frequency which will suppress the fat component at that frequency. The null frequency may be selected to maximize the extent of fat suppression, for example, by selecting the resonant frequency of fat as the null frequency. The depth of the null may also be modified in order to change the extent to which the fat signal is suppressed and the bandwidth of the null widened in order to suppress off-resonance fat. Finally, the disclosed RF pulse sequences may be utilized to excite off-resonance components such as water.

The various techniques to be more fully set forth below provide a significant amount of flexibility in choosing the amount of excitation on and off resonance and the degree of suppression on and off resonance. As a result, the MR imaging techniques disclosed herein are particularly well suited for use in the areas of breast diagnosis, vascular imaging, musculoskeletal imaging, neuroimaging and therapy. In breast diagnosis, the MR images produced in accordance with the teachings of the present invention are useful for the diagnostic evaluation of breast abnormalities for identification, localization and characterization of lesions and, in particular for the diagnosis of lesions not visible using conventional mammography techniques or in patients that cannot be well imaged by mammography. Furthermore, when used in conjunction with the injection of contrast agent gadolinium diethylentriamine pentaacetic acid (or "Gd-DPTA") into the tissue during the generation of the RF pulse sequence and post-echo collection processing techniques such as maximum intensity projection, surface rendering and segmentation visualization, such tumors within the breast tissue will be clearly visible in the resultant images.

In vascular imaging, the present invention may be used in diagnostics, or in combination with processing techniques such as maximum intensity projection, may produce images, either slices or vascular specific images, to diagnose abnormalities in blood vessels. The techniques described herein may also be used to produce high quality MR angiograms because of the improved suppression of fat which increases diagnostic utility of MR angiograms. In musculoskeletal imaging, the present invention may be used for diagnostic evaluations of joints such as the knee, ankle, foot, hip, shoulder, elbow, wrist and hands and may be used to produce images that improve identification, localization and characterization of disorders. For example, image data from diagnostic examinations of musculoskeletal masses and bone marrow abnormalities can be used in the reconstructed slice method or combined with image processing to render three dimensional viewing, lesion specific analysis, and/or vascular images. In neuroimaging, the present invention may be used for diagnostic imaging of cranial, head and neck, orbital, spinal, and peripheral nervous system abnormalities for identification, localization, and characterization of lesions using reconstructed slices or image processing to yield volume displays, vascular images, or lesion therapy.

Finally, it is further contemplated that the method of producing MR images of tissue utilizing multiple shaped RF pulse sequences may be used in therapeutic applications as well. The MR imaging techniques disclosed herein may be combined with treatment techniques including, but not limited to, ablation techniques, for example, laser ablation treatment, radiofrequency delivered hyperthermia, ultrasonic treatment, or radiation to control the localization and delivery of therapy in the destruction of a lesion. More specifically, it is contemplated that MR images may be produced and utilized as a guide in the application of therapy. For example, in removing a lesion from surrounding healthy tissue, MR images may be produced in real time using the techniques described herein and then utilized to distinguish the boundaries of a lesion. Then, using a therapeutic delivery system, for example, laser treatment, the lesion may be removed without the unintentional removal of health tissue by observing the lesion/healthy tissue boundary and location of the therapeutic delivery system visible in the produced image followed by the controlled removal of the lesion only, again by carefully observing the lesion/healthy tissue boundary and the location of the therapeutic delivery system.

Specifically referring now to FIGS. 2a–b, the method of MR imaging where a selective shaped RF pulse may suppress and/or excite chemical components in tissue, for example, fat and/or water, during the generation of such MR images commences at step 100 and, at step 102, certain image processing parameters are selected. Specifically, processing parameters S(MAX), E(MAX) and K(MAX), where E(MAX) is the number of phase encoding pulses $G_{ENCODE}$ to be consecutively generated for each phase encoding pulse $G_{SLICE}$, S(MAX) is the number of phase encoding pulses $G_{SLICE}$ generated for each two dimensional slice of the object 14 being imaged and K(MAX) is the total number of values for which an echo is acquired for an S, E combination. Suitable parameters for the sequence of the RF and magnetic field gradient pulses are E(MAX)=128, S(MAX)=128 and K(MAX)=1,024. These parameters would produce 16,384 echoes for each slice and, once assembled into a three dimensional image of the object 14, would correspond to a field of view of 20 cm for the object 14.

Proceeding on to step 104, the processing parameters S and E are each set to one. At step 106, pulse sequences for the waveform, phase and frequency components of the RF waveform are selected based upon the characteristics, for example, the frequency dispersion of the fat and water components, of the object 14 to be imaged. Further details regarding the multiple shaped RF pulse sequences will be described with respect to FIGS. 3–4, below and specific examples of the selection of various pulse sequences based upon the characteristics of the object 14 to be imaged and the images produced thereby shall be described with respect to FIGS. 5a–11g.

Proceeding to step 108, and assuming that the center of the object 14 being imaged is the origin of a Cartesian coordinate system, a static homogenous magnetic field directed along the z axis of the Cartesian coordinate system is generated and, at step 110, an RF pulse sequence is generated by the RF transmitter coil 36 to create transverse magnetism within the object 14. Specifically, the RF transmitter coil 36 simultaneously generates the selected waveform, phase and frequency components of the RF pulse sequence in the presence of the uniform magnetic field to produce the aforementioned transverse magnetism. Proceeding to step 114, gradient magnetic fields are generated along the z, as well as the x and y, axes of the Cartesian coordinate system. As to be more fully described herein, the generated gradient magnetic fields include a first phase encoding gradient magnetic field directed along the x axis and hereafter referred to as the $G_{SLICE}$ gradient magnetic field, a frequency encoding gradient magnetic field directed along the y axis and hereafter referred to as the $G_{READ}$ gradient magnetic field, and a second phase encoding gradient magnetic field directed along the z axis and hereafter referred to as the $G_{ENCODE}$ gradient magnetic field.

More specifically, at step 114, a first phase encoding pulse $G_{SLICE-1}$ is generated along the x axis and a first phase encoding pulse $G_{ENCODE-1}$ is generated along the z axis. Most commonly, the first phase encoding pulses $G_{SLICE-1}$ and $G_{ENCODE-1}$ correspond to the application of the phase encoding gradients full force in a positive direction along the x and z axes, respectively. During the generation of the phase encoding pulses $G_{SLICE-1}$ and $G_{ENCODE-1}$ (step 114), the $G_{READ}$ frequency encoding pulse is negative, thereby dephasing the spins within the object 14. At step 116, the $G_{READ}$ frequency encoding pulse goes positive, thereby permitting the acquisition of an echo for the first phase encoding pulses $G_{SLICE-1}$ and $G_{ENCODE-1}$. Accordingly, at step 118, a first echo corresponding to the 1,024K values for each S, E combination is acquired. Typically, the acquired echo will be characterized by an echo time on the order of 2.8 to 3.2 msec. The frequency encoding $G_{READ}$ pulse sequence then returns to zero, thereby ending the acquisition of the echo. Continuing on to step 120, rewinder gradients are then applied along the slice and phase axes. Typically, the rewinder gradients should have a magnitude equal to the phase encoding pulses $G_{SLICE}$ and $G_{PHASE}$ and generated in the opposite direction thereto. At step 122, a spoiler pulse is applied along the slice axis to spoil the steady state RF generated spin echo.

Proceeding to step 124, it is then determined whether the immediately previous generated phase-encoding pulse $G_{SLICE}$ is the S(MAX) phase-encoding pulse generated for E=1. If it is determined at step 124 that the immediately previous generated phase-encoding pulse $G_{SLICE}$ is not the S(MAX) generated pulse for E=1, S is incremented by one at step 126 and, at step 128, the method of the present invention returns to step 110 for the acquisition of additional echoes. If, however, it is determined at step 124 that S=S(MAX), the method of the present invention proceeds to step 130 where it is determined whether E=E(MAX) for the immediately previously generated phase-encoding pulse $G_{ENCODE}$.

If it is determined at step 130 that the immediately previous generated phase-encoding pulse $G_{ENCODE}$ is not the E(MAX) generated pulse, E is incremented by 1 at step 132, S is re-set to 1 at step 134 and, at step 136, the method of the present invention returns to step 110 for the acquisition of additional echoes. This sequential collection of data for the production of MR images is repeatedly acquired for each successive gradient echo generated with phase encoding gradients $G_{SLICE}$ and $G_{ENCODE}$ applied with full strength in a positive direction and then applying successively $G_{SLICE}$ values with less strength until, during the middle phase encoding pulses, $G_{SLICE}$ is turned off and during the last phase encoding pulse, $G_{SLICE}$ is applied full force in a negative direction. $G_{SLICE}$ is then re-set and a similar sequential collection of data is performed for a next $G_{ENCODE}$ until data has been collected for the entire series of $G_{SLICE}$ values from full strength in the positive direction to full strength in the negative direction. If, however, it is determined at step 130 that E=E(MAX), the method of the present invention proceeds to step 146 (see FIG. 2b) where an image is produced from the collected data.

More specifically, at step 146, processing of the acquired data commences. Typically, the acquired data may be viewed as a matrix of dimensions 128×128×1024. This viewing matrix corresponds to a field of view of 20 cm. At step 146, therefore, the acquired data matrix is processed to determine the signal intensity at each location, thereby producing an image of the object by the application of well known Fourier transform data processing techniques. Accordingly, the data matrix is transformed into a series of frequency data views in the frequency domain by applying a first series of Fourier transforms in the time direction. At step 148, an image of the object is produced by applying a second and third series of Fourier transforms in the slice phase encode direction and in the phase encode direction. Preferably, the frequency domain should be oversampled to avoid aliasing data. Finally, the method subject of the present invention ends at step 150.

Figure 3A:
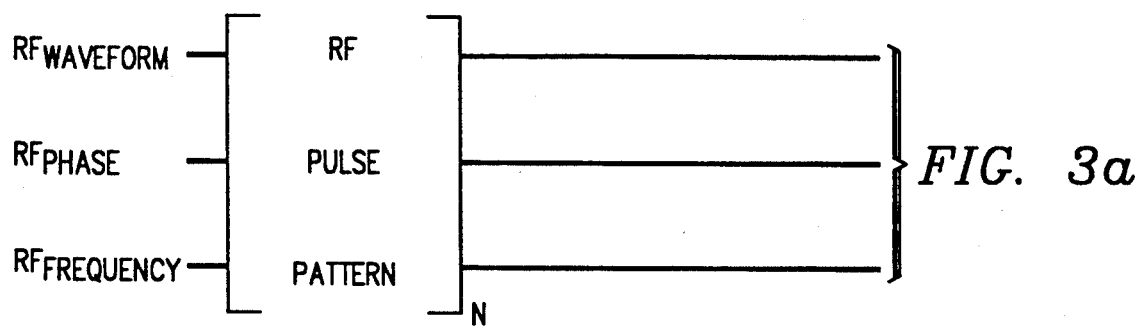
FIG. 3a is a schematic diagram of a shaped radiofrequency pulse sequence generated to produce transverse magnetization within tissue to be imaged in accordance with the magnetic resonance imaging technique subject of the present application.
Figure 3B:
FIG. 3b is a schematic diagram of a first phase encoding pulse sequence to be generated along a first axis.
Figure 3C:
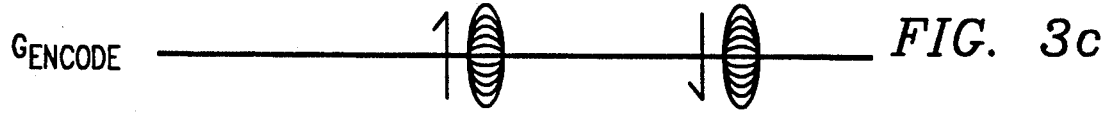
FIG. 3c is a schematic diagram of a first frequency encoding pulse sequence to be generated along a second axis.
Figure 3D:
FIG. 3d is a schematic diagram of a second phase encoding pulse sequence to be generated along a third axis.
Figure 3E:
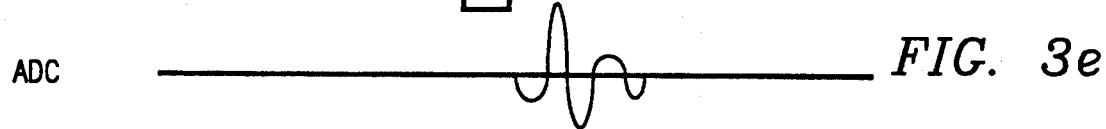
Figure 4:
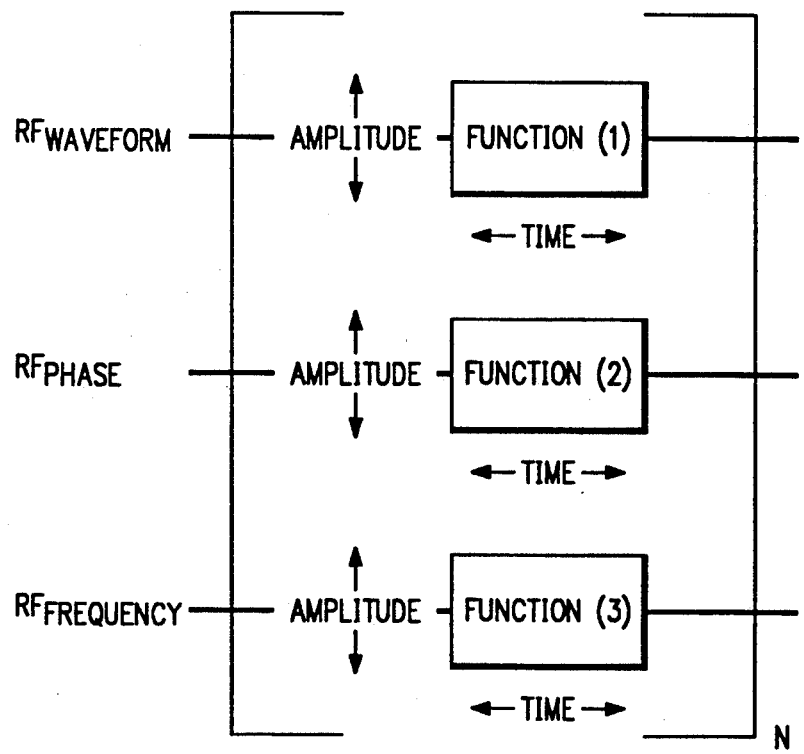
Figure 5A:
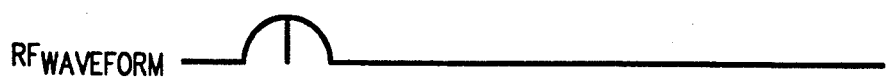
Figure 5B:
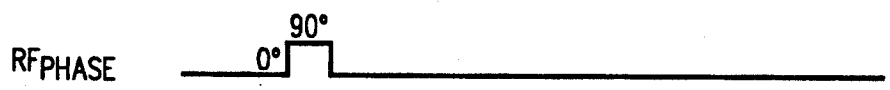
Figure 5C:
Figure 5D:
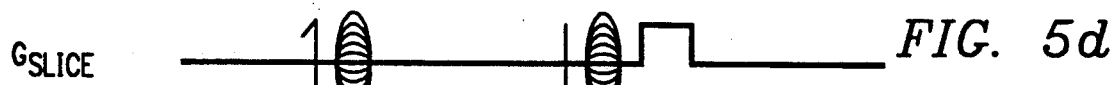
FIGS. 5d–f are schematic diagram of a first phase encoding pulse sequence, a first frequency encoding pulse sequence and a second phase encoding pulse sequence to be generated along first, second and third axes, respectively.
Figure 5E:
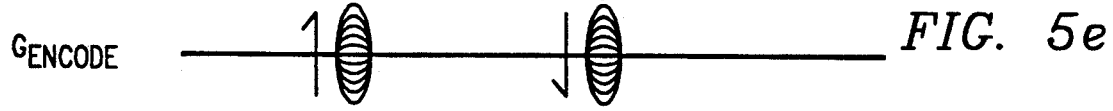
Figure 5F:
Figure 5G:
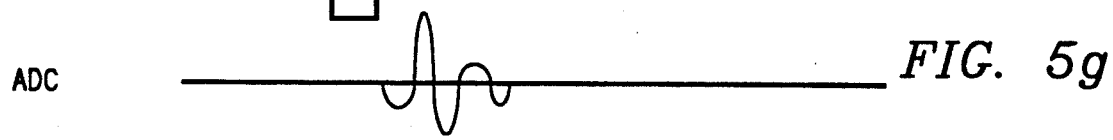
FIG. 5g is a schematic diagram of an echo sequence produced by the generation of the pulse sequences of FIGS. 5d–f in the presence of the transverse magnetization produced by the pulse sequence of FIGS. 5a–c.
Figure 6A:
Figure 6B:
Figure 6C:
Figure 6D:
FIGS. 6d–f are schematic diagram of a first phase encoding pulse sequence, a first frequency encoding pulse sequence and a second phase encoding pulse sequence to be generated along first, second and third axes, respectively.
Figure 6E:
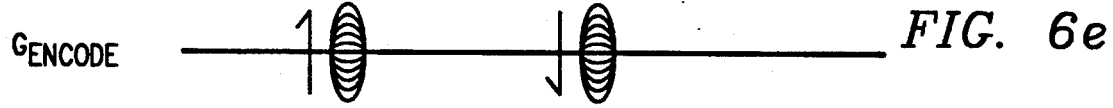
Figure 6F:
Figure 6G:
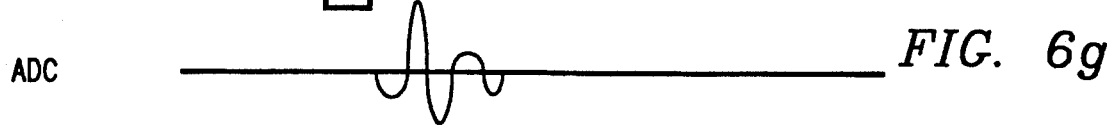
FIG. 6g is a schematic diagram of an echo sequence produced by the generation of the pulse sequences of FIGS. 6d–f in the presence of the transverse magnetization produced by the pulse sequence of FIGS. 6a–c.
Figure 7A:
Figure 7B:
Figure 7C:
Figure 7D:
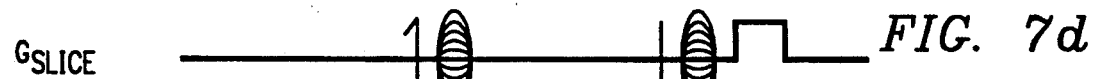
FIGS. 7d–f are schematic diagram of a first phase encoding pulse sequence, a first frequency encoding pulse sequence and a second phase encoding pulse sequence to be generated along first, second and third axes, respectively.
Figure 7E:
Figure 7F:
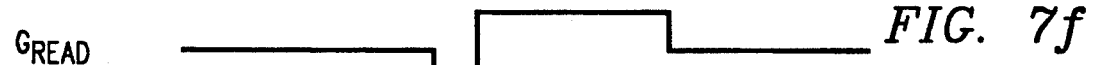
Figure 7G:
FIG. 7g is a schematic diagram of an echo sequence produced by the generation of the pulse sequences of FIGS. 7d–f in the presence of the transverse magnetization produced by the pulse sequence of FIGS. 7a–c.
Figure 8A:
Figure 8B:
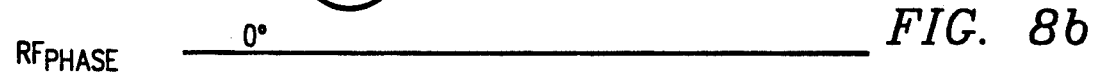
Figure 8C:
Figure 8D:
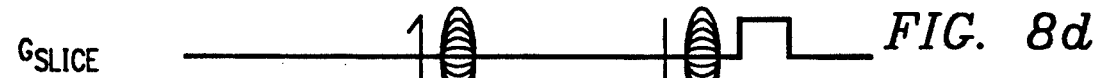
FIGS. 8d–f are schematic diagram of a first phase encoding pulse sequence, a first frequency encoding pulse sequence and a second phase encoding pulse sequence to be generated along first, second and third axes, respectively.
Figure 8E:
Figure 8F:
Figure 8G:
FIG. 8g is a schematic diagram of an echo sequence produced by the generation of the pulse sequences of FIGS. 8d–f in the presence of the transverse magnetization produced by the pulse sequence of FIGS. 8a–c.

Referring next to FIGS. 3a-4, the selected multiple shaped RF pulse sequence shall now be described in greater detail. As may be seen in FIG. 3a, the subject RF pulse sequence includes three separate components: RFwaveform, RFphase and RFfrequency, each of which may have its own pattern. It is further contemplated that the RF pulse pattern may be repeated "N" times where N may be any integer 1, 2, 3, etc. It should be noted, however, that while N can be any integer up to the range 6-8 without difficulty, the ability to select N to be greater than 8 would likely depend on the echo times.

Referring now to FIG. 4, each component RFwaveform, RFphase and RFfrequency is comprised of a respective function f(1), f(2), and f(3) of a specified amplitude and time where f(1), f(2), and/or f(3) may be identical or dissimilar to one or both of the other pulse pattern functions. Each of these functions f(1), f(2) and f(3) are selected from the following function list:

constant x;
ramp;
sin (or cos);
tan (or cot);
sec (or csc);
sin c x;
exp (or log);
sech (or csch);
sin h (or cos h);
tan h (or cot h);
Bessel functions, including:
  1st type;
  2nd type;
function$^{(n)}$, n=0, 1, ...;
function$^{(function)}$; and
function($<>$)$^{(function)}$;
  where $<> = +, -, *, /$.

Furthermore, it should be noted that each of the functions f(1), f(2) and f(3) may be repeated, thereby yielding multiple iterations of a single pulse pattern, or changed for any number of the N iterations of the RF pulse sequence.

Referring next to FIG. 5a-g, another embodiment of the present invention shall now be described in detail. Here, the RF pulse sequence is selected to include a waveform component having first and second facing sinusoidal functions, either a sine function or a cosine function, which, due to the phase component being comprised of first and second sections at 0 and 90 degrees, respectively, effectively extend from 0 to (pi)/2 and (pi) to 3(pi)/2 radians, respectively. The RF frequency component, on the other hand, remains constant. To generate this RF pulse sequence, N is set to two where N1 does not equal N2 for both the waveform and frequency components. Preferably, the waveform component pulse sequence is centered at the resonance frequency for the primary fat signal, i.e. about 64 MHz., such that the profile of the frequency response has a null at the frequency of the primary fat signal. This particular pulse sequence permits the suppression of fat off resonance while permitting the excitation of water on resonance. It is contemplated that this embodiment of the invention would be useful for increasing the amount of signal detected in three dimensional MR images of the brain, extremities, knee and breast, increasing the attenuation of signal from fat in MR images of the brain, extremities, knee and breast, increasing the signal from blood when water is off resonance, and improving suppression of the signal from fat in three dimensional MR images.

Referring next to FIG. 6a–g, yet another embodiment of the invention may now be seen. Again, the RF pulse sequence is selected to include a waveform component having first and second facing sinusoidal functions, either a sine function or a cosine function. Here, however, the phase components are now at 0 and 180 degrees while the RF frequency component remains constant. To generate this RF pulse sequence, N is set to two where N1 does not equal N2 for both the waveform and frequency components. Preferably, the waveform component pulse sequence is centered at the resonance frequency for the primary fat signal, i.e. about 64 MHz., such that the profile of the frequency response has a null at the frequency of the primary fat signal. In contrast to the embodiment illustrated in FIG. 5a–g, this particular embodiment of the invention would have increased excitation of the water component while maintaining the suppression of the fat component. It is contemplated that this embodiment of the invention would be useful for increasing the amount of signal detected in three dimensional MR images of the brain, extremities, knee and breast, increasing the attenuation of signal from fat in MR images of the brain, extremities, knee and breast, increasing the amount of T1 weighting in fat suppressed three dimensional images of the brain, extremities, knee, and breast, and improving suppression of the signal from fat in three dimensional MR images.

Referring next to FIG. 7a–g, still yet another embodiment of the invention shall be described in greater detail. Here, the RF pulse sequence is selected to include four waveform sections, each having the shape of a sinusoidal function. By increasing the number of RF waveform sections to four, a broader null zone is produced, thereby yielding improved fat suppression. Also, by providing the RF pulse sequence with three or more sections, some refocusing of spins off resonance is permitted. This gives good fat suppression, a useful amount of T1 weighting and improved image contrast due to the holding of magnetization in the transverse plane. It is contemplated that this embodiment of the invention would be useful for increasing the signal from blood when water is off resonance.

Referring next to FIG. 8a–g, yet another embodiment of the present invention shall now be described in greater detail. Here, the RF pulse sequence is selected to include a waveform component having the shape and amplitude of a sine function which extends from 0 to 2(pi) radians and RF phase and frequency components which are held constant. To generate this RF pulse sequence, N is set to one. Preferably, the waveform component pulse sequence is centered at the resonance frequency for the primary fat signal, i.e. about 64 MHz. such that the signal from water receives maximum excitation while the signal from fat is suppressed. In terms of width and degree of fat suppression and water excitation off resonance, the RF pulse sequence illustrated in FIGS. 8a–c exhibits intermediate behavior between the FATS type pulse sequence previously described and the pulse sequence described below with respect to FIGS. 9a–c, although, in general, the pulse sequence of FIGS. 8a–c tends to have a wider bandwidth null for fat frequency and a larger excitation of the water off resonance in the resultant image, thereby altering the amount of T1 weighting in the final images. It is, therefore, specifically contemplated that this embodiment of the invention would be useful for increasing the amount of signal detected in three dimensional MR images of the brain, extremities, knee and breast, increasing the attenuation of signal from fat in MR images of the brain, extremities, knee and breast, increasing the signal from blood when water is off resonance, and improving the suppression of the signal from fat in three dimensional MR images.

Referring next to FIGS. 9a–g, still yet another embodiment of the present invention shall now be described in greater detail. Here, the RF pulse sequence is selected to include a waveform component having the shape and amplitude of a sine function which extends from 0 to 4(pi) radians and a phase component having a (pi) radian shift at the midpoint, i.e. 2(pi), of the RF pulse sequence. Again, the RF frequency is held constant. To generate this RF pulse sequence, N is set to two where N1=N2 for the waveform and frequency components and N1=N2 for the waveform component. Preferably, the phase shift is positioned at the resonance frequency for the primary fat signal, i.e. about 64 MHz. such that the signal from water receives maximum excitation while the signal from fat is suppressed. It has been discovered that this particular RF pulse sequence provides a broader null bandwidth for fat frequency and a larger excitation of the water off resonance, thereby increasing the amount of T1 weighting in the final images. As before, by increasing the number of RF waveform sections to four, the aforementioned broader null zone is produced, thereby yielding improved fat suppression. Also, by providing the RF pulse sequence with three or more sections, some refocusing of spins off resonance is permitted. This gives good fat suppression, a useful amount of T1 weighting and improved image contrast due to the holding of magnetization in the transverse plane. It is, therefore, specifically contemplated that this embodiment of the invention would be useful for increasing the amount of signal detected in three dimensional MR images of the brain, extremities, knee and breast, increasing the amount of T1 weighting in fat suppressed three dimensional images of the brain, extremities, knee and breast, increasing the signal from blood when water is off resonance, and suppressing the signal from fat in three dimensional MR images.

Referring next to FIGS. 10a–g, yet another embodiment of the invention will be described in detail. Here, the RF pulse sequence is selected to include a HILBERT[sin(x)/x)] waveform component and a phase component having a (pi) radian shift at the midpoint of the RF waveform sequence. Again, the RF frequency is held constant. To generate this RF pulse sequence, N is set to six where N1 does not equal N2 does not equal N3 does not equal N4 does not equal N5 does not equal N6 for the waveform component, (N1=N2=N3) does not equal (N4=N5=N6) for the phase component and N1=N2=N3=N4=N5=N6 for the frequency component. Preferably, the phase shift between N=3 and N=4 is positioned at the resonance frequency for the primary fat signal, i.e. about 64 MHz., such that the signal from water receives maximum excitation while the signal from fat is suppressed. As before, by increasing the number of RF waveform sections to six, a broader null zone is produced, thereby yielding improved fat suppression. Also, by providing the RF pulse sequence with three or more sections, some refocusing of spins off resonance is permitted. This gives good fat suppression, a useful amount of T1 weighting and improved image contrast due to the holding of magnetization in the transverse plane. It has been discovered that while this particular RF pulse sequence does not suppress the fat signal as effective as other embodiments of the invention disclosed herein, a broad off resonance frequency excitation provides a strong water excitation. Thus, this embodiment of the invention would be particularly useful in imaging objects with where the need for fat suppression is less pressing and/or water excitation is of greater importance. For example, it is specifically contemplated that this embodiment of the invention would be particularly useful for increasing the amount of signal detected in three dimensional MR images of the brain, extremities, knee and breast, increase the amount of T1 weighting in fat suppressed three dimensional images of the brain, extremities, knee and breast and suppressing the signal from fat in three dimensional MR images.

Referring next to FIGS. 11a–g, still yet another embodiment of the invention will be described in detail. Here, the RF pulse sequence is modified to include a prepulse which alters the produced image appearence or contrast by selectively attenuating signal from tissue water as a function of tissue type. For example, the signal from meniscus would attenuate differently than the signal from a meniscal lesion and, within the breast, the signal from normal parenchma would attenuate more than the signal from a breast tumor or lesion.

Figure 12:
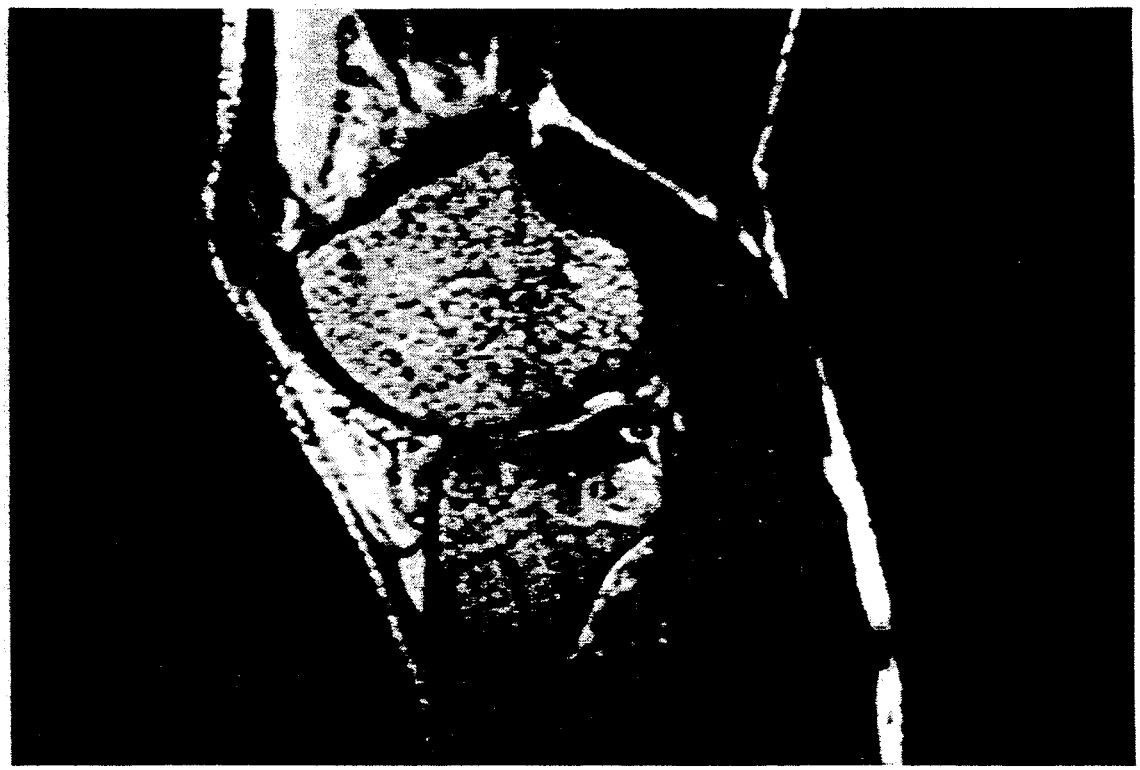
FIG. 12 is an image of a knee produced using a prior 3D GRASS MR imaging technique.

Referring next to FIG. 12, a single sagittal image from a prior 3D "GRASS" (or "Gradient echo acquired in the steady state") magnetic resonance volume image of the knee. The slice thickness is about 1.4 mm, the field of view is 16 cm, and a total of $128 \times 128 \times 256$ points were obtained using a repetition time of 25 msec and an echo time of 4.5 msec. Fat is the brightest signal in the image.

Figure 9A:
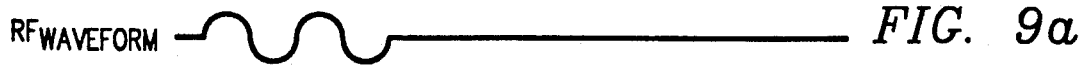
Figure 9B:
Figure 9C:
Figure 9D:
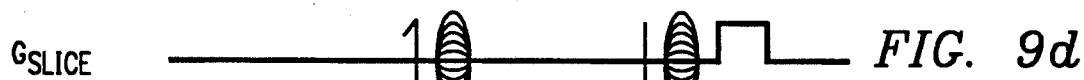
FIGS. 9d–f are schematic diagram of a first phase encoding pulse sequence, a first frequency encoding pulse sequence and a second phase encoding pulse sequence to be generated along first, second and third axes, respectively.
Figure 9E:
Figure 9F:
Figure 9G:
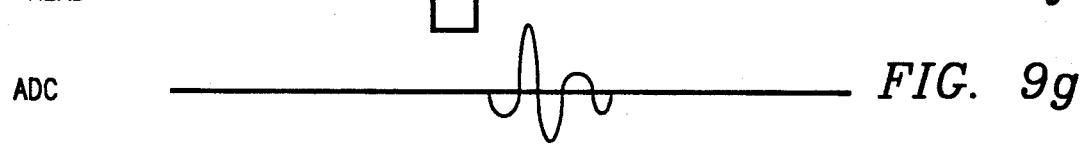
FIG. 9g is a schematic diagram of an echo sequence produced by the generation of the pulse sequences of FIGS. 9d–f in the presence of the transverse magnetization produced by the pulse sequence of FIGS. 9a–c.
Figure 10A:
Figure 10B:
Figure 10C:
Figure 10D:
FIGS. 10d–f are schematic diagram of a first phase encoding pulse sequence, a first frequency encoding pulse sequence and a second phase encoding pulse sequence to be generated along first, second and third axes, respectively.
Figure 10E:
Figure 10F:
Figure 10G:
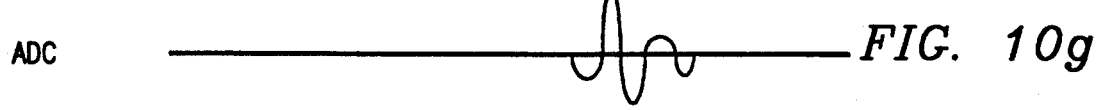
FIG. 10g is a schematic diagram of an echo sequence produced by the generation of the pulse sequences of FIGS. 10d–f in the presence of the transverse magnetization produced by the pulse sequence of FIGS. 10a–c.
Figure 13:
FIG. 13 is an image of a knee produced using the RODEO MR imaging technique illustrated in FIGS. 9a–g.

Referring next to FIG. 13, a single sagittal image from a 3D "RODEO" (or "Rotating delivery of excitation off-resonance in the steady state") magnetic resonance volume image of the knee such as that produced using the RF pulse sequence illustrated in FIGS. 9a–c may now be seen. The slice thickness is about 1.4 mm, the field of view is 16 cm, and a total of $128 \times 128 \times 256$ points were obtained using a repetition time of 20 msec and an echo time of 3.5 msec. The transmitter was positioned at the frequency of fat, resulting in the attenuation of fat signal from bone and fatty soft tissues.

Figure 14:
FIG. 14 is an image of a breast produced using a prior 3D GRASS MR imaging technique.
Figure 15:
FIG. 15 is an image of a breast produced using the RODEO MR imaging technique illustrated in FIGS. 9a–g.

Referring next to FIG. 14, a single sagittal image from a prior 3 D GRASS magnetic resonance volume image of the breast. The slice thickness is about 1.4 mm, the field of view is 20 cm, and a total of $128 \times 128 \times 256$ points were obtained using a repetition time of 25 msec and an echo time of 4.5 msec;

Referring next to FIG. 15, a single sagittal image from a 3 D RODEO magnetic resonance volume image of the breast such as that produced using the RF pulse sequence illustrated in FIGS. 9a–c may now be seen. The slice thickness is about 1.4 mm, the field of view is 16 cm, and a total of $128 \times 128 \times 256$ points were obtained using a repetition time of 20 msec and an echo time of 3.5 msec. The transmitter was positioned at the frequency of fat, resulting in the attenuation of fat signal from fatty soft tissues in the breast.

Figure 16:
FIG. 16 is an image of a breast produced using the RODEO MR imaging technique illustrated in FIGS. 9a–g after injection of gadolinium DTPA.

Referring next to FIG. 16, a single sagittal image from another 3 D RODEO magnetic resonance volume image of the breast obtained 5 minutes after injection of gadolinium DTPA. The slice thickness is about 1.4 mm, the field of view is 16 cm, and a total of $128 \times 128 \times 256$ points were obtained using a repetition time of 20 msec and an echo time of 3.5 msec. The transmitter was positioned at the frequency of fat, resulting in the attenuation of fat signal from bone and fatty soft tissues. The regions of tumor appear hyperintense in the image compared to the RODEO image obtained without gadolinium DTPA contrast.

Figure 17:
FIG. 17 is a saggital view of an image of a breast produced using the RODEO MR imaging technique illustrated in FIGS. 9a–g after injection of gadolinium DTPA and image processing using a pixel ray casting technique.

Referring next to FIG. 17, a sagittal view of the maximum pixel ray casting of the 3 D RODEO magnetic resonance volume image of the breast obtained after administration of gadolinium DTPA may now be seen. The entire 3 D volume image has been projected to highlight areas of high signal intensity corresponding to disease within the breast. Blood vessels also appear bright in the image.

Figure 18:
FIG. 18 is a coronal view of an image of a breast produced using the RODEO MR imaging technique illustrated in FIGS. 9a–g after injection of gadolinium DTPA and image processing using a pixel ray casting technique.

Referring next to FIG. 18, a coronal view of the maximum pixel ray casting of the 3 D RODEO magnetic resonance volume image of the breast obtained after administration of gadolinium DTPA. The entire 3 D volume image has been projected to highlight areas of high signal intensity corresponding to disease within the breast. Blood vessels also appear bright in the image.

Figure 19:
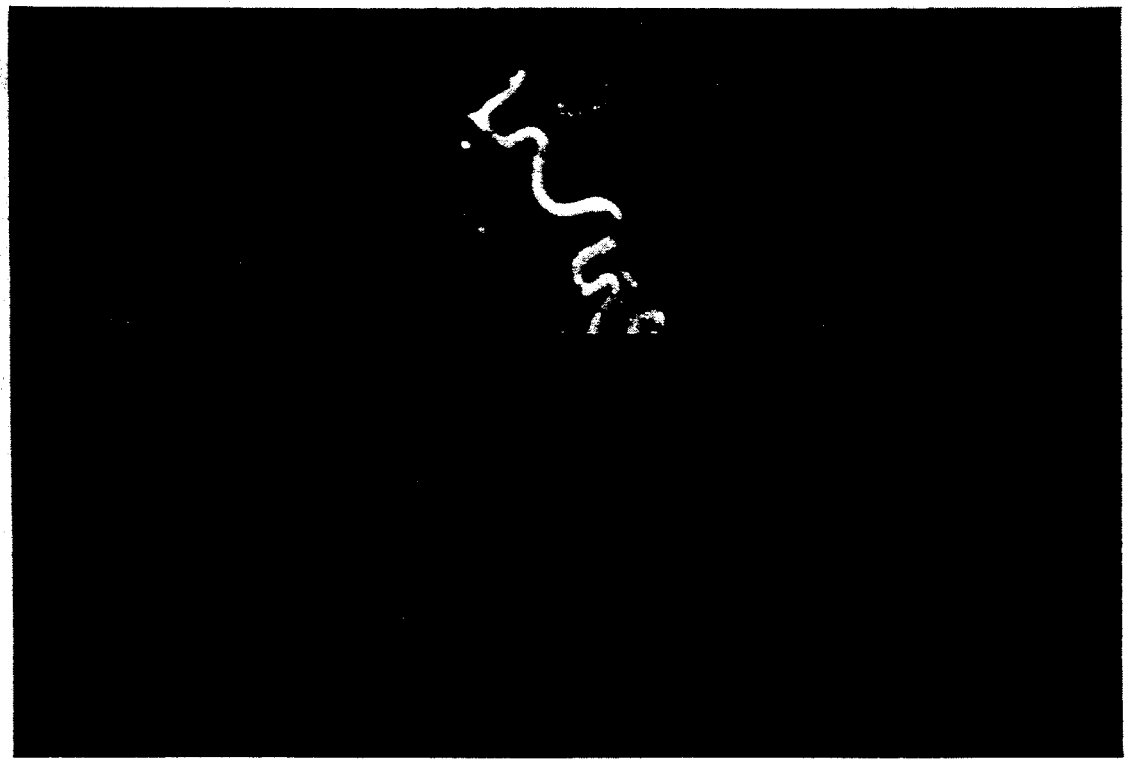
FIG. 19 is a lateral view of an image of a neck produced using the RODEO MR imaging technique illustrated in FIGS. 9a–g.

Referring next to FIG. 19, a lateral view of the maximum pixel ray casting of the 3 D RODEO magnetic resonance volume image of the neck. No contrast material was administered to enhance the appearance of the image. The carotid artery has high signal intensity, and the RODEO method provides excellent suppression of background signal from water in the surrounding soft tissues.

Thus, there has been described and illustrated herein various methods for producing an image of an object using MR techniques in which various components within the object can be selectively suppressed and/or enhanced, respectively. However, those skilled in the art will recognize that many modifications and variations besides those specifically mentioned may be made in the techniques described herein without departing substantially form the concept of the present invention. Accordingly, it should be clearly understood that the form of the invention described herein is exemplary only and is not intended as a limitation on the scope of the invention.

What is claimed is:

1. A method of producing an image of an object, comprising the steps of:
   generating a uniform magnetic field to magnetize said object;
   selecting a shaped pulse sequence for each of waveform, phase and frequency components of an RF signal;
   generating an RF signal comprised of said selected waveform, amplitude and frequency pulse sequences, said generated signal producing transverse magnetization in said object;
   generating first, second, and third changing magnetic fields in said object;
   receiving a series of gradient echoes in response to said generated RF pulse sequence; and
   producing an image of said object.

2. A method of producing an image of the interior of an object having fat and water components therein, comprising the steps of:
generating a uniform magnetic field to magnetize said object;
generating an RF signal comprised of a first and second sinusoidal function waveform components, said generated signal producing transverse magnetization in said object;
generating first, second, and third changing magnetic fields in said object;
receiving a series of gradient echoes in response to said generated RF pulse sequence; and
producing an image of said object.

3. A method of producing an image of the interior of an object according to claim 2 wherein said first and second sinusoidal function waveform components comprise a pair of facing sinusoidal signals.

4. A method of producing an image of the interior of an object according to claim 3 wherein said sinusoidal function is a sine function.

5. A method of producing an image of the interior of an object according to claim 3 wherein said sine function is centered at the primary resonance frequency for said fat component of said object.

6. A method of producing an image of the interior of an object according to claim 3 wherein said sinusoidal function is a cosine function.

7. A method of producing an image of the interior of an object according to claim 6 wherein said cosine function is centered at the primary resonance frequency for said fat component of said object.

8. A method of producing an image of the interior of an object having fat and water components therein, comprising the steps of:
generating a uniform magnetic field to magnetize said object;
generating an RF signal comprised of a sinusoidal function waveform component, said generated signal producing transverse magnetization in said object;
generating first, second, and third changing magnetic fields in said object;
receiving a series of gradient echoes in response to said generated RF pulse sequence; and
producing an image of said object.

9. A method of producing an image of the interior of an object according to claim 8 wherein said sinusoidal function is a sine function.

10. A method of producing an image of the interior of an object according to claim 9 wherein said sine function is centered at the primary resonance frequency for said fat component of said object.

11. A method of producing an image of the interior of an object according to claim 9 wherein said sinusoidal function is a cosine function.

12. A method of producing an image of the interior of an object according to claim 9 wherein said cosine function is centered at the primary resonance frequency for said fat component of said object.

13. A method of producing an image of the interior of an object according to claim 9 wherein said (pi) radian phase shift for said phase component is located at the primary resonance frequency for said fat component of said object.

14. A method of producing an image of the interior of an object having fat and water components therein, comprising the steps of:
generating a uniform magnetic field to magnetize said object;
generating an RF signal comprised of a sin function waveform component and a phase component having first and second sections separated by a (pi) radian phase shift, said generated signal producing transverse magnetization in said object;
generating first, second, and third changing magnetic fields in said object;
receiving a series of gradient echoes in response to said generated RF pulse sequence; and
producing an image of said object.

15. A method of producing an image of the interior of an object according to claim 14 wherein said sin function waveform component is comprised of first and second sine curves, each extending 2(pi) radians and wherein the transition between said first and second sine curves is located at the primary resonance frequency for said fat component of said object.

16. A method of producing an image of the interior of an object according to claim 15 wherein said (pi) radian phase shift for said phase component is located at the primary resonance frequency for said fat component of said object.

17. A method of producing an image of the interior of an object having fat and water components therein, comprising the steps of:
generating a uniform magnetic field to magnetize said object;
generating an RF signal comprised of an H[(sin (x)/x)] function waveform component and a phase component having first and second sections separated by a (pi) radian phase shift, said generated signal producing transverse magnetization in said object;
generating first, second, and third changing magnetic fields in said object;
receiving a series of gradient echoes in response to said generated RF pulse sequence; and
producing an image of said object.

18. A method of producing an image of the interior of an object according to claim 17 wherein said H[(sin (x)/x)] function waveform component is comprised of first, second, third, fourth, fifth and sixth components and wherein the transition between said third and fourth components is located at the primary resonance frequency for said fat component of said object.

19. A method of producing an image of the interior of an object according to claim 18 wherein said (pi) radian phase shift for said phase component is located at the primary resonance frequency for said fat component of said object.

* * * * *

UNITED STATES PATENT AND TRADEMARK OFFICE
CERTIFICATE OF CORRECTION

PATENT NO. : 5,202,631
DATED : April 13, 1993
INVENTOR(S) : Steven E. Harms, et al.

It is certified that error appears in the above-indentified patent and that said Letters Patent is hereby corrected as shown below:

Column 12, line 32, "sin c x" should be --sinc x--.

Column 12, line 35, "sin h" should be --sinh--.

Column 12, line 36, "tan h" should be --tanh--.

Signed and Sealed this

Twenty-ninth Day of March, 1994

Attest:

BRUCE LEHMAN

Attesting Officer

Commissioner of Patents and Trademarks